(12) United States Patent
Kim et al.

(10) Patent No.: US 6,901,097 B2
(45) Date of Patent: May 31, 2005

(54) SEMICONDUCTOR LASER DIODE AND METHOD FOR FABRICATING THE SAME

(75) Inventors: Tae-geun Kim, Seoul (KR); Ok-hyun Nam, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 17 days.

(21) Appl. No.: 10/188,973

(22) Filed: Jul. 5, 2002

(65) Prior Publication Data

US 2003/0067953 A1 Apr. 10, 2003

(30) Foreign Application Priority Data

Oct. 9, 2001 (KR) ........................................ 2001-62079

(51) Int. Cl.$^7$ ................................................ H01S 5/00
(52) U.S. Cl. ........................................ 372/45; 372/46
(58) Field of Search ................................ 372/43–46, 50

(56) References Cited

U.S. PATENT DOCUMENTS 5,070,510 A * 12/1991 Konushi et al. .............. 372/46
5,373,173 A * 12/1994 Ohata et al. .................. 257/88

(Continued)

FOREIGN PATENT DOCUMENTS

| EP | 0 507 516 A1 | 10/1992 |
|---|---|---|
| JP | 61-003491 A | 1/1986 |
| JP | 2000-058981 | 2/2000 |
| KR | 10-0265801 B1 | 9/2000 |

OTHER PUBLICATIONS

M. Ogura et al., "AlGaAs/GaAs buried quantum well laser diodes by one time selective metalorganic chemical vapor deposition growth on dielectric window strips," Applied Physics Letters, American Institute of Physics, New York, US, vol. 62, No. 26, Jun. 28, 1993, pp. 3417–3419.

M. C. Wu et al., "Optical and Electrical Characteristics of GaAs/AlGaAs GRIN–SCH Lasers Grown Selectively by MBE on SiO$_2$–Patterned Substrate," International Electron Devices Meeting, Washington, Dec. 6–9, 1987, New York, US, IEEE, Dec. 6, 1987, pp. 909–912.

A. Jain et al., "Chemical Vapor Deposition of Copper from Hexafluoroacetylacetonato Copper(l) Vinyltrimethylsilane Deposition Rates, Mechanism, Selectivity, Morphology, and Resistivity as a Function of Temperature and Pressure," Journal of the Electrochemical Society, Electrochemical Society, Inc., Manchester, New Hampshire, US, vol. 140, No. 5, May 1993, pp. 1434–1439.

*Primary Examiner*—Minsun Oh Harvey
*Assistant Examiner*—Phillip Nguyen
(74) *Attorney, Agent, or Firm*—Burns, Doane, Swecker & Mathis, L.L.P.

(57) ABSTRACT

A semiconductor laser diode and a manufacturing for fabricating the same are provided. The semiconductor laser diode includes a substrate, masks that are formed at both sides of the substrate, a light generating layer that is formed on the substrate between the masks, current blocking layers that are formed on the masks, respectively, and first and second electrode that are formed on the bottom surface of the substrate and on the top surface of the light generating layer, respectively. The optical generating layer and the current blocking layer are simultaneously formed through single growth, and the current blocking layer confines current and light in a lateral direction in the light generating layer. Thus, a semiconductor laser diode manufacturing process can be simplified, and threshold current for laser oscillation can be lowered.

34 Claims, 7 Drawing Sheets

U.S. PATENT DOCUMENTS

| | | | |
|---|---|---|---|
| 5,656,539 A | * 8/1997 | Motoda et al. | 438/39 |
| 5,864,575 A | * 1/1999 | Ohiso et al. | 372/96 |
| 5,923,691 A | * 7/1999 | Sato | 372/46 |
| 5,966,396 A | * 10/1999 | Okazaki et al. | 372/46 |
| 5,981,977 A | 11/1999 | Furukawa et al. | |
| 6,084,901 A | * 7/2000 | Suzuki | 372/96 |
| 6,091,083 A | * 7/2000 | Hata et al. | 257/79 |
| 6,127,200 A | * 10/2000 | Ohiso et al. | 438/46 |
| 6,185,238 B1 | * 2/2001 | Onomura et al. | 372/46 |
| 6,285,694 B1 | * 9/2001 | Shigihara | 372/45 |
| 6,319,742 B1 | * 11/2001 | Hayashi et al. | 438/46 |
| 6,420,198 B1 | * 7/2002 | Kimura et al. | 438/22 |
| 6,456,638 B1 | * 9/2002 | Fukunaga | 372/45 |
| 6,463,088 B1 | * 10/2002 | Baillargeon et al. | 372/46 |
| 6,618,412 B2 | * 9/2003 | Shigihara | 372/45 |
| 6,697,404 B1 | * 2/2004 | Sato | 372/45 |
| 2002/0001864 A1 | * 1/2002 | Ishikawa et al. | 438/22 |
| 2002/0003914 A1 | * 1/2002 | Sakata | 385/1 |
| 2002/0022288 A1 | * 2/2002 | Hayashi et al. | 438/47 |
| 2002/0024981 A1 | * 2/2002 | Tojo et al. | 372/45 |

* cited by examiner

SEMICONDUCTOR LASER DIODE AND METHOD FOR FABRICATING THE SAME

Priority is claimed to patent application Ser. No. 2001-62079 filed in Republic of Korea on Oct. 9, 2001, herein incorporated by reference.

BACKGROUND OF THE INVENTION

1. Field of the Invention

The present invention relates to a semiconductor laser diode and a method for fabricating the same, and more particularly, to a nitride semiconductor laser diode having a buried heterostructure (BH) for maximizing an electric optical confinement effect in a lateral direction using a selective growth technique, and a method for fabricating the same.

2. Description of the Related Art

In general, since semiconductor laser diodes are comparatively small and threshold current for laser oscillation of the semiconductor laser diode is smaller than that of a conventional laser device, semiconductor laser diodes have been widely using as devices for high speed data transmission or high speed data recording and reading in communications or players in which optical discs are used.

In particular, nitride semiconductor laser diodes generate laser with wavelength from green to an ultraviolet region, being widely applied in high-density optical information storing and reproducing, high-resolution laser printers, and projection TVs.

Likewise, as the semiconductor laser diode is widely used in various fields, a semiconductor laser diode having low threshold current and high efficiency is emerging, and a ridge-type semiconductor laser diode and a semiconductor laser diode having a buried heterostructure (BH) are representative of semiconductor laser diodes having low threshold current and high efficiency.

Figure 1:
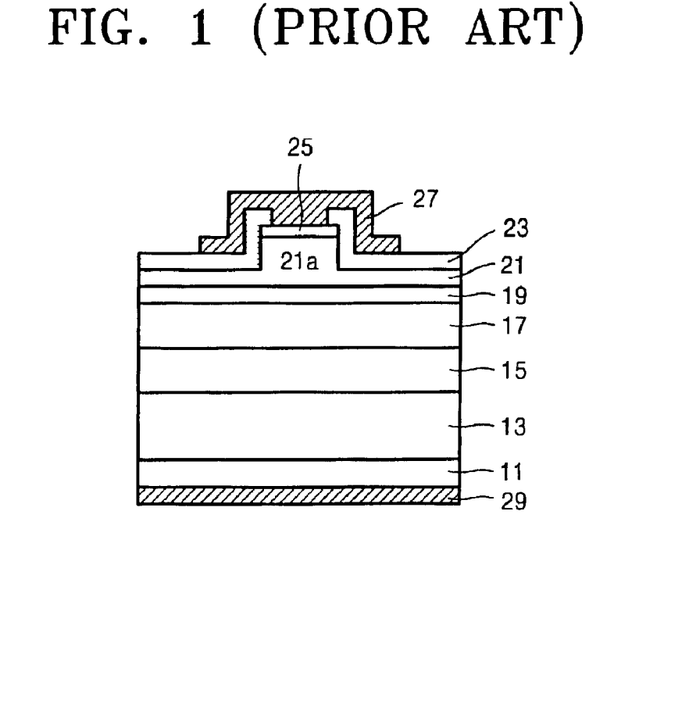
FIG. 1 is a cross-sectional view of a conventional ridge-type semiconductor laser diode.

FIG. 1 is a cross-sectional view of a conventional ridge-type semiconductor laser diode and shows a semiconductor laser diode having a ridge so as to reduce threshold current for laser oscillation and realize the stability of a mode.

Referring to FIG. 1, the ridge-type semiconductor laser diode has a structure in which an n-type cladding layer 13, an n-type waveguide layer 15, an active layer 17, a p-type waveguide layer 19, a p-type cladding layer 21 are sequentially stacked on a substrate 11. The reflective indices of the n-type and p-type cladding layers 13 and 21 are lower than the reflective indices of the n-type and p-type waveguide layers 15 and 19, and the reflective indices of the n-type and p-type waveguide layers 15 and 19 are lower than the reflective index of the active layer 17. The p-type cladding layer 21 has a ridge 21a projected in an upper middle portion of the p-type cladding layer 21. The ridge 21a of the p-type cladding layer 21 confines current injection, thereby limiting a resonance region for laser oscillation in the active layer 17. A capping layer 25 is stacked on the top surface of the ridge 21a of the p-type cladding layer 21. The top surface of the p-type cladding layer 21 excluding the ridge 21a is covered with a current confinement layer 23, and the top surface of the capping layer 25 excluding a middle portion, which becomes a current path, is covered with the current confinement layer 23. A p-type electrode 27 is formed in the middle portion of the top surface of the capping layer 25 and on the top surface of the p-type cladding layer 21, and an n-type electrode 29 is formed on the bottom surface of the substrate 11.

The ridge-type semiconductor laser diode is fabricated by re-growing the current confinement layer 23 after stacking and growing the n-type cladding layer 13, the n-type waveguide layer 15, the active layer 17, the p-type waveguide layer 19, the p-type cladding layer 21, and the capping layer 25 on the substrate 11 and forming a ridge structure through a predetermined etching process.

In the ridge-type semiconductor laser diode, due to the ridge structure, current injection is confined causing the width of resonance to be limited, and thus an optical mode is improved a little compared with a conventional non-ridge structure, and threshold current for laser oscillation is lowered.

Figure 2:
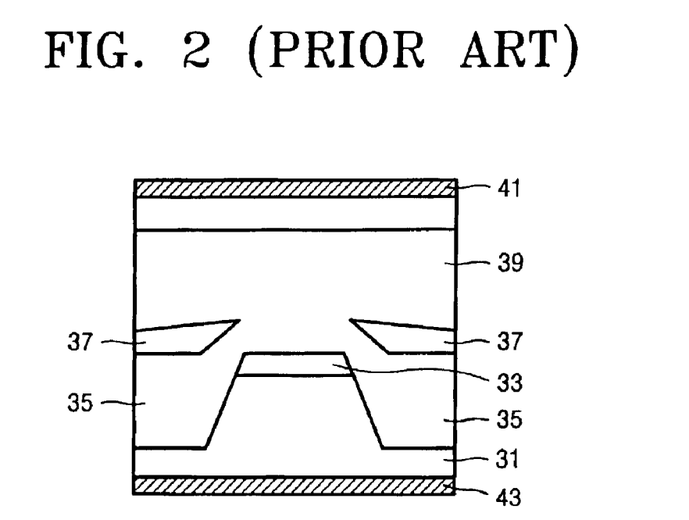
FIG. 2 is a schematic cross-sectional view of a semiconductor laser diode having a buried heterostructure (BH)

FIG. 2 is a schematic cross-sectional view of a semiconductor laser diode having a buried heterostructure (BH). Referring to FIG. 2, an active layer 33 is formed on the top surface of an n-type compound semiconductor layer 31 having a mesa structure, and p-type and n-type current blocking layers 35 and 37 for confining current and light are formed at both sides of the mesa structure including the active layer 33. A p-type compound semiconductor layer 39 is formed on the active layer 33 and the current blocking layers 35 and 37. A p-type electrode 41 is formed on the top surface of the p-type compound semiconductor layer 39, and an n-type electrode 43 is formed on the bottom surface of the n-type compound semiconductor layer 31.

The semiconductor laser diode having a BH as above is fabricated by growing the active layer 33 on the n-type compound semiconductor layer 31 through liquid phase epitaxy (LPE) or metal organic chemical vapor deposition (MOCVD), forming the mesa structure through a predetermined etching process and re-growing the current blocking layers 35 and 37 and the p-type compound semiconductor layer 39.

The semiconductor laser diode having a BH has advantages such as small threshold current and stable oscillation horizontal mode characteristics, because the up and down and right and left sides of the active layer 33 are surrounded by the n-type and p-type compound semiconductor layers 31 and 39 and the current blocking layers 35 and 37, respectively, and thus it is known that the semiconductor laser diode having a BH has performance higher than the ridge-type semiconductor laser diode.

However, it is not easy in the nitride semiconductor laser diode to perform etching and re-growth processes for growing the BH, unlike other III-V group semiconductor laser diodes, and thus the nitride semiconductor laser diode is still dependent on a basic ridge structure.

This is the reason the nitride semiconductor layer generates laser with wavelength from green to ultraviolet region, whereas there are problems on lattice constant inconsistency, high melting point, and hardness of a material when constituting a composite material, and thus there are difficulties in making variation such as re-growth when growing the structure of a laser diode, and in a process such as a wet etching process.

However, the conventional ridge-type nitride semiconductor laser diode has problems such as instability of optical mode characteristics due to the shape and depth of etching, increase in threshold current due to weak index-guide, and deterioration of long-term reliability due to the exposure of an etching surface. Thus, in order to fabricate a laser diode having low threshold current and high output required in high-density optical recording and reproducing, the development of a nitride semiconductor laser diode having an improved structure such as the BH is required.

SUMMARY OF THE INVENTION

To solve the above problems, it is an object of the present invention to provide a nitride semiconductor laser diode having a high-efficiency buried heterostructure (BH) for maximizing current and optical constraint effects by merging a selective growth technique using a mask into a technique for growing a current blocking layer on a mask through control of the mixed ratio of a III-V group based compound and a growth temperature, and a method for fabricating the same.

Accordingly, to achieve the above object, according to one aspect of the present invention, there is provided a semiconductor laser diode. The semiconductor laser diode includes a substrate, masks that are formed at both sides of the substrate, a light generating layer that is formed on the substrate between the masks, current blocking layers that are formed on the masks, respectively, for confining current and light in a lateral direction in the light generating layer, and first and second electrodes that are formed on the bottom surface of the substrate and on the top surface of the light generating layer, respectively.

Preferably, the light generating layer includes a first cladding layer, an active layer, and a second cladding layer, which are sequentially formed on the substrate, and the light generating layer further includes a first waveguide layer that is formed between the first cladding layer and the active layer, and a second waveguide layer that is formed between the second cladding layer and the active layer.

Preferably, the light generating layer is a nitride-based compound semiconductor layer, and the nitride-based compound semiconductor layer is a GaN-based compound semiconductor layer. Preferably, the mask is a $SiO_2$ mask, and the current blocking layer is a poly-AlGaN layer or a-AlGaN layer.

Preferably, the diode further includes a current confinement layer between the second electrode and the light generating layer, and the current confinement layer is a polyimide layer.

To achieve the above object, according to another aspect of the present invention, there is provided a method for fabricating a semiconductor laser diode. The method includes forming masks at both sides of a substrate, respectively, simultaneously forming a light generating layer and a current blocking layer on the substrate between the masks and on the mask, respectively, forming first and second electrodes on the bottom surface of the substrate and on the top surface of the light generating layer, respectively.

Preferably, the step of forming a light generating layer includes the step of sequentially forming a first cladding layer, an active layer, and a second cladding layer on the substrate, and the method further includes forming a first waveguide layer between the first cladding layer and the active layer, and forming a second waveguide layer between the second cladding layer and the active layer. Preferably, before forming first and second electrodes, a current confinement layer for confining current flowing from the second electrode is formed on the light generating layer, and the current confinement layer is formed of polyimide.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

Hereinafter, the present invention will be described in detail by describing preferred embodiments of the invention with reference to the accompanying drawings.

Figure 3:
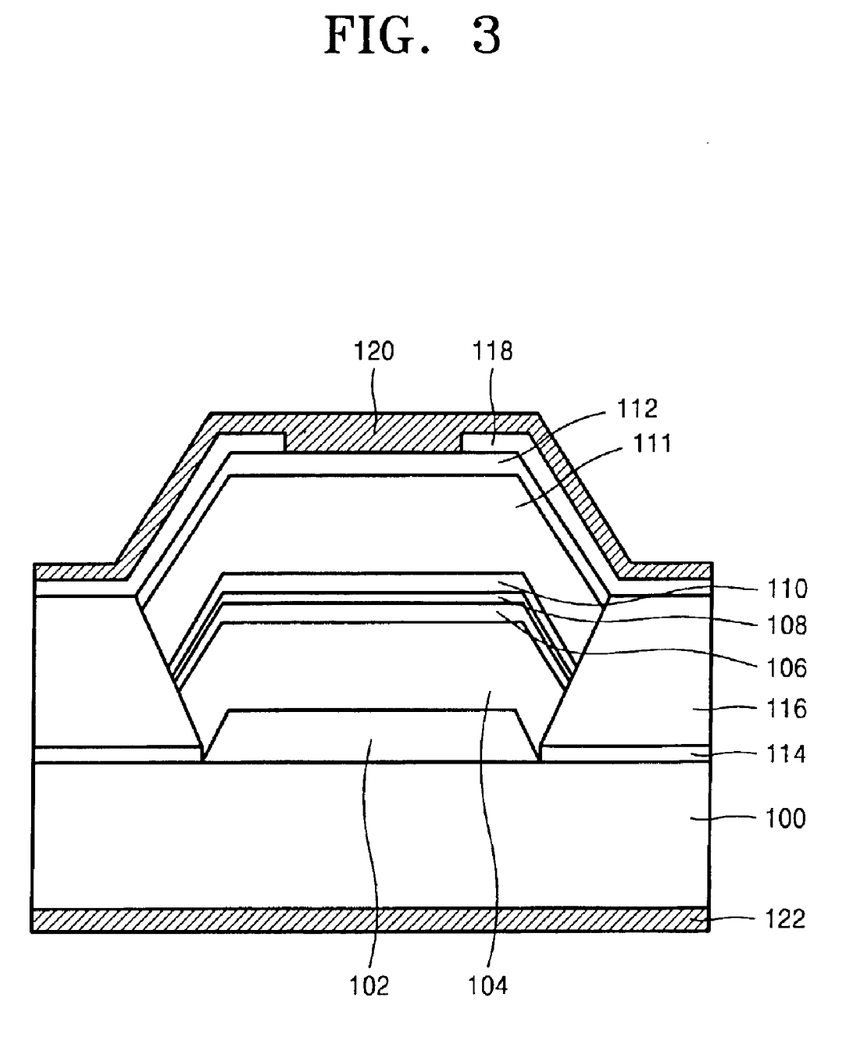
FIG. 3 is a cross-sectional view of a semiconductor laser diode according to an embodiment of the present invention.

FIG. 3 is a cross-sectional view of a semiconductor laser diode according to an embodiment of the present invention. Referring to FIG. 3, a mask 114 is formed at both sides of a substrate 100, respectively. Preferably, the substrate 100 may be formed of a substrate capable of growing gallium nitride or a gallium nitride-based material. Thus, preferably, the substrate 100 may be a GaN substrate or sapphire substrate. Preferably, the mask 114 may be formed of $SiO_2$. A first compound semiconductor layer 102, a first cladding layer 104, a first waveguide layer 106, an active layer 108, a second waveguide layer 110, a second cladding layer 111, and a second compound semiconductor layer 112 are sequentially stacked on the substrate 100 between the masks 114, thereby forming a mesa-shaped optical generating layer. The first and second compound semiconductor layers 102 and 112 are GaN-based III-V group compound semiconductor layers and are formed of an n-GaN layer and a p-GaN layer, respectively. The first and second cladding layers 104 and 111, respectively are formed of an n-AlGaN/GaN layer and a p-AlGaN/GaN layer, respectively. The first and second waveguide layers 106 and 110 for guiding laser oscillation are compound semiconductor layers having reflective indices higher than the first and second cladding layers 104 and 111 and are formed of an n-GaN layer and a p-GaN layer, respectively. The active layer 108 for generating laser oscillation is a compound semiconductor layer having a reflective index higher than the first and second waveguide layers 106 and 110 and is formed of a GaN layer or InGaN layer.

A current blocking layer 116 is formed at both sides of the light generating layer having a mesa structure. The current blocking layer 116 is a nonconductive insulating layer having a reflective index lower than the active layer 108 and is grown and formed on the $SiO_2$ mask 114. The current blocking layer 116 may be a polycrystalline AlGaN (hereinafter, poly-AlGaN) layer or amorphous AlGaN (hereinafter, a-AlGaN) layer on conditions of growth on the $SiO_2$ mask 114.

The top surfaces of the second compound semiconductor layer 112 and the current blocking layer 116 excluding a middle region of the second compound semiconductor layer 112 through which current flows, are covered with a current confinement layer 118. The current confinement layer 118 reduce threshold current by confining current flowing the light generating layer and is formed of a polyimide layer.

A second electrode 120 as a p-type electrode, is formed in a region through which current flows, of the second compound semiconductor layer 112 on the top surface of the current confining layer 118, and a first electrode 122 as an n-type electrode, is formed on the bottom surface of the substrate 100.

In the semiconductor laser diode having the above structure, the current blocking layer 116, which is grown and formed on the SiO$_2$ mask 114, is an insulating layer having a reflective index lower than the active layer 108, and thus confines laser in a lateral direction in the active layer 108, and simultaneously blocks current flowing from the second electrode 120, which is formed on the bottom surface of the substrate 100, as well as the first electrode 122 into the light generating layer. The current blocking layer 116 electrically isolates adjacent semiconductor laser diodes.

FIGS. 4A through 4D illustrate a method for fabricating the semiconductor laser diode of FIG. 3. Referring to FIGS. 4A through 4D, the mask (SiO$_2$ mask) 114 is formed at both sides of the substrate 100 (GaN substrate or sapphire substrate) (see FIG. 4A). The light generating layer and the current blocking layer 116 are simultaneously epitaxially grown on the substrate 100 between the masks 114 and on the mask 114 through metal organic chemical vapor deposition (MOCVD) (see FIG. 4B). The light generating layer that is formed on the substrate 100 between the masks 114 is a GaN-based compound semiconductor layer and includes a first compound semiconductor layer (n-GaN layer) 102, a first cladding layer (n-AlGaN/GaN layer) 104, a first waveguide layer (n-GaN layer) 106, an active layer (GaN layer or InGaN layer) 108, a second waveguide layer (p-GaN layer) 110, a second cladding layer (p-AlGaN/GaN layer) 111, and a second compound semiconductor layer (p-GaN layer) 112, which are sequentially stacked and formed on the substrate 100. The light generating layer is formed of mesa-shaped monocrystalline layers on the substrate 100 between the masks 114. FIG. 5 illustrates that the light generating layer is grown to a mesa structure between SiO$_2$ masks 114 in an nitrogen atmosphere.

Figure 6:
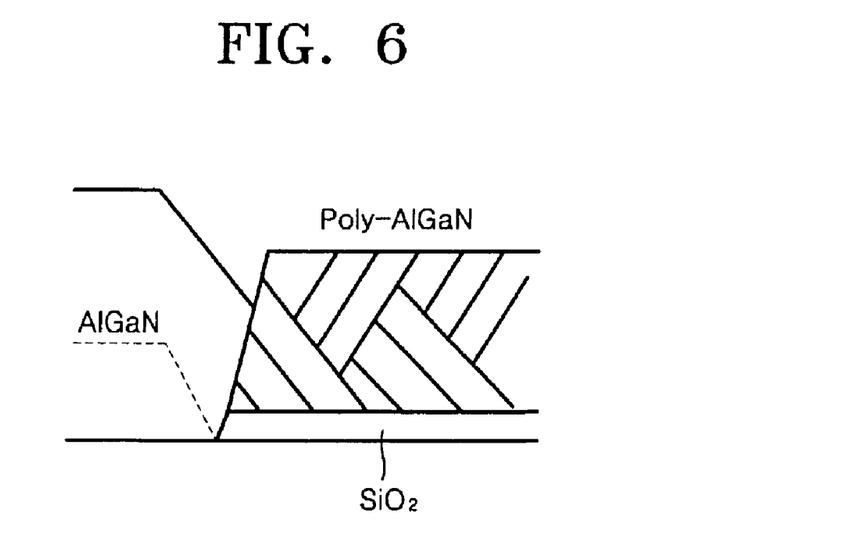
FIG. 6 illustrates that a poly-AlGaN layer is formed on the mask.

Preferably, the current blocking layer 16, that is formed on the mask 114 in a vertical direction may be a poly-AlGaN layer or a-AlGaN layer as an insulator and confines current and light in a lateral direction in the light generating layer. In principle, a growth nucleus does not exist on the SiO$_2$ mask 114, and thus crystalline growth in a vertical direction is difficult. However, if the ratio of V/III group is increased and a growth temperature is lowered, Al and Ga particles remain on the SiO$_2$ mask 114. Thus, in such a case, the remaining Al and Ga particles are used as a growth nucleus, AlGaN is grown two-dimensionally, thereby forming a polycrystalline poly-AlGaN layer or amorphous a-AlGaN layer. FIG. 6 illustrates that a poly-AlGaN layer is formed even on an insulator (SiO$_2$ mask) on which a growth nucleus does not exist, on conditions of a high ratio of the V/III group and a growth temperature.

As described above, a process of simultaneously forming the light generating layer and the current blocking layer 116 is performed by a selective growth technique using the SiO$_2$ mask 114 and a growth technique for forming a poly-AlGaN layer or a-AlGaN layer on the SiO$_2$ mask 114 through control of the ratio of a V/III group and a growth temperature. Thus, in order to fabricate a good semiconductor laser diode, conditions that a poly-AlGaN layer or a-AlGaN layer as an insulator, is formed on the SiO$_2$ mask 114 and a good monocrystalline layer is formed in a region between the masks 114 on the substrate 100, that is, it is important to decide the optimum ratio of the V/III group and the optimum growth temperature.

Figure 4A:
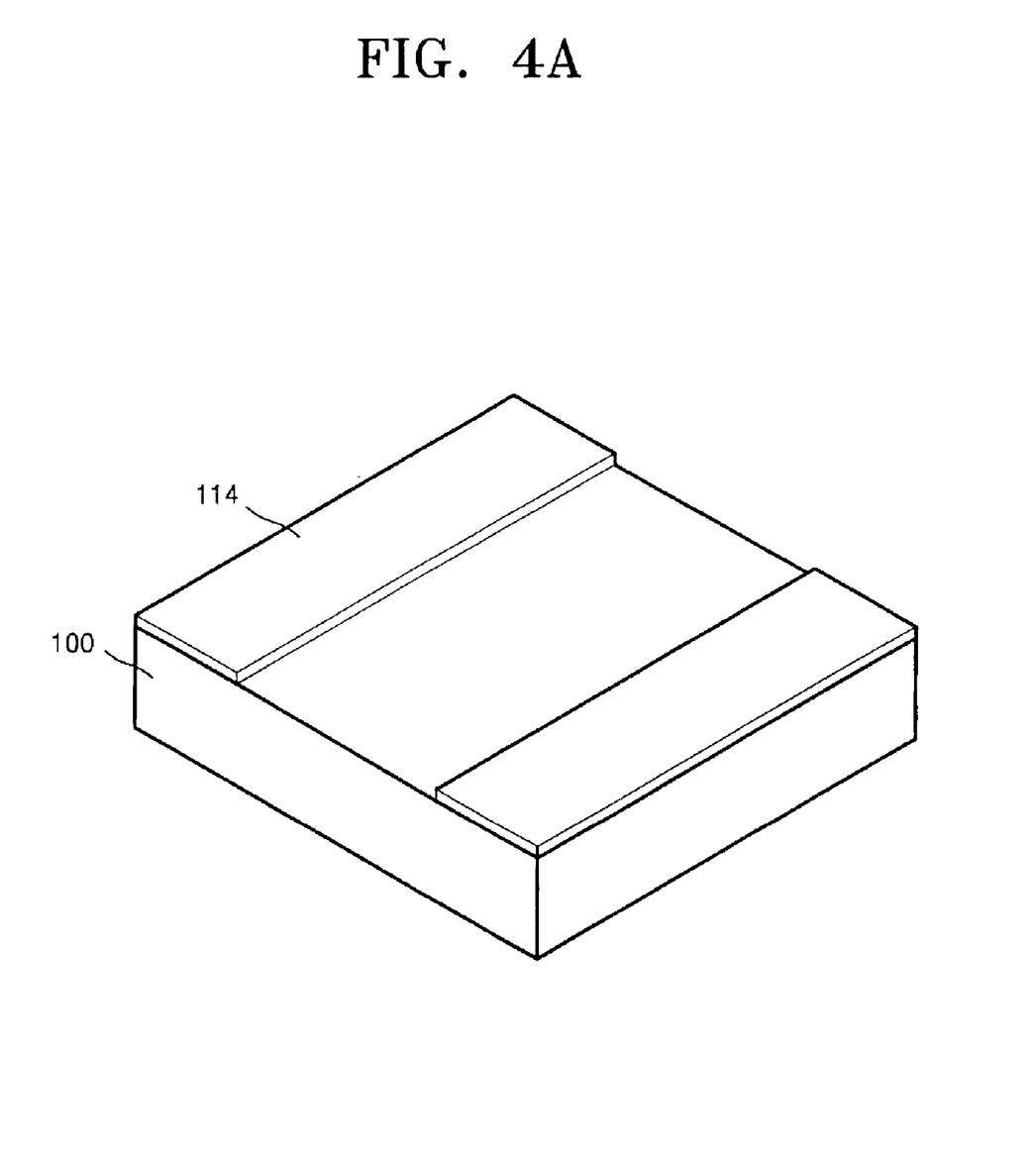
FIGS. 4A through 4D illustrate a method for fabricating the semiconductor laser diode of FIG. 3.
Figure 4B:
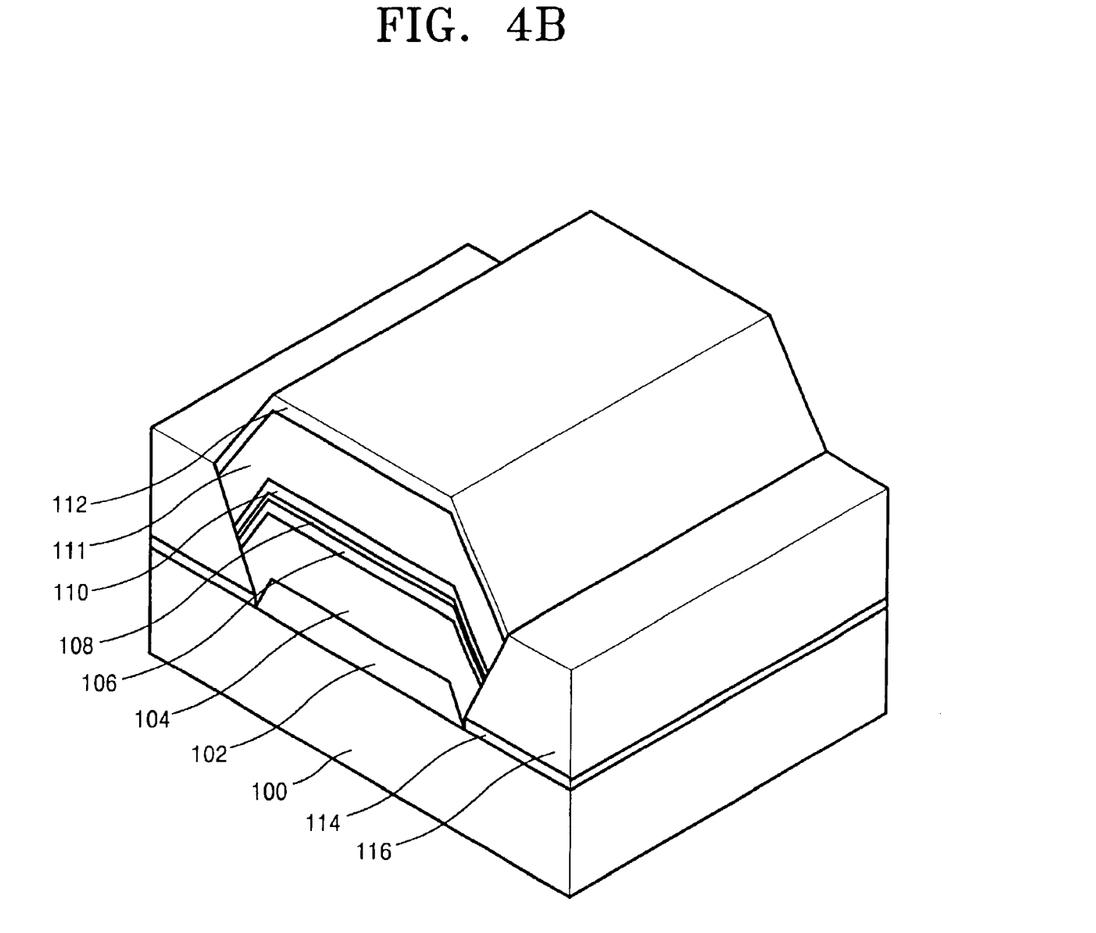
Figure 4C:
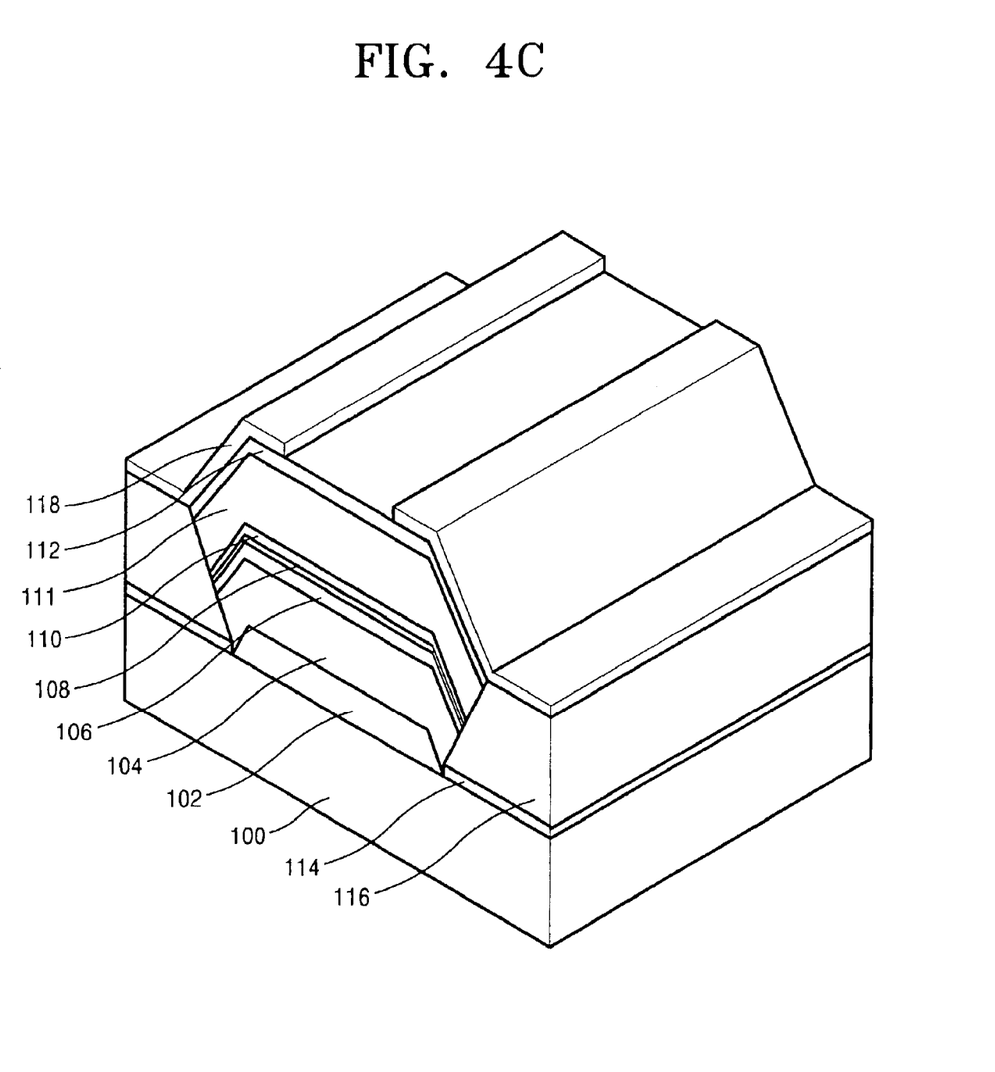
Figure 5:
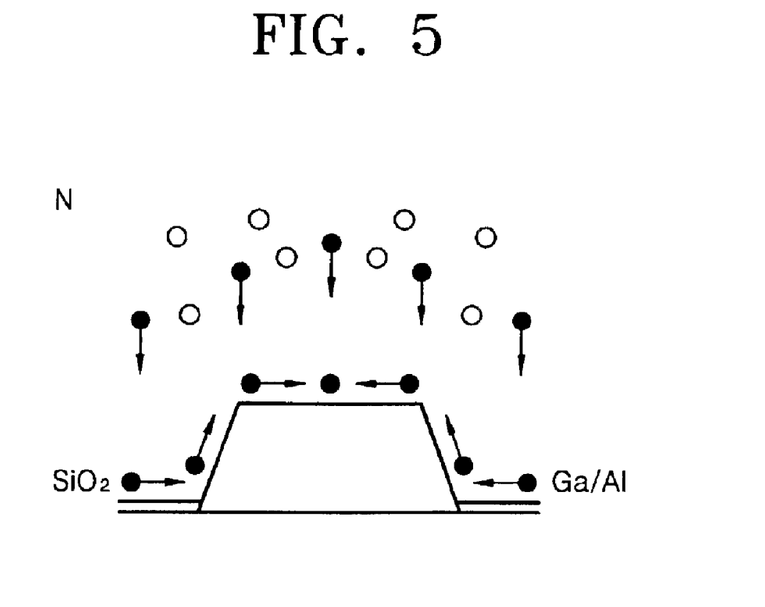
FIG. 5 illustrates a mesa structure growth mechanism on a substrate between masks.

The current confinement layer 118 is formed on the top of the light generating layer and the current blocking layer 116 (see FIG. 4C). The current confinement layer 118 is formed by the same shape as that in FIG. 4C by providing a current path on the light generating layer through development or O$_2$ ashing after coating polyimide on the top of the light generating layer and the current blocking layer 116.

Figure 4D:
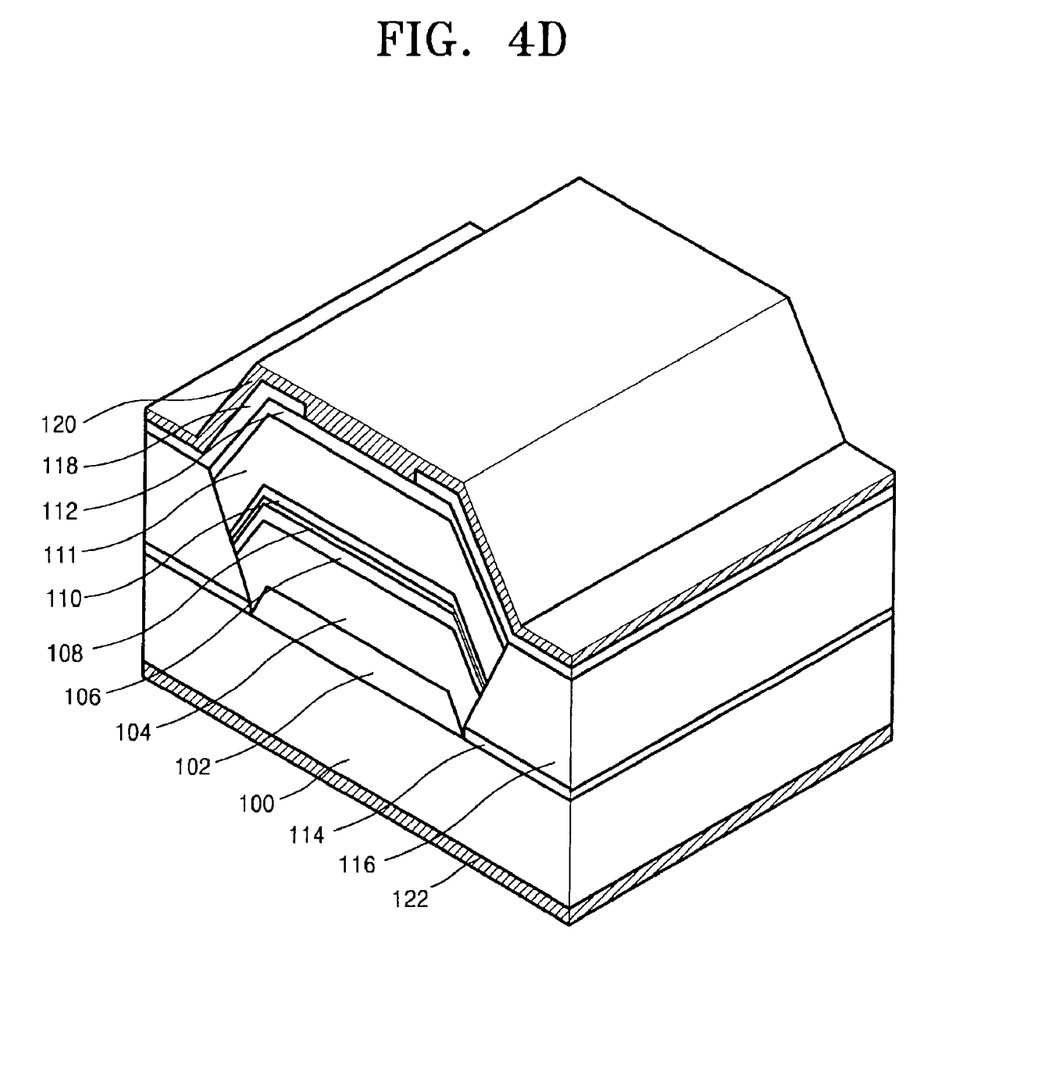

Last, the second electrode 120 as a p-type electrode, is formed on the light generating layer in which a current path is formed, and the first electrode 122 as an n-type electrode, is formed on the bottom surface of the substrate 100 (see FIG. 4D).

As above, the semiconductor laser diode having the BH forms the light generating layer and the blocking layer through single growth causing processes such as a dry etching process such as chemically assisted ion beam etching (CAIBE) for growing a ridge-type structure, or an etching process for growing a conventional buried structure, and re-growth to be unnecessary.

As describe above, the semiconductor laser diode having the BH according to the present invention can increase an optical confinement effect in the active layer when applying bias and can effectively prevent current that is leaked outside the active layer by confining current in twice. In addition, the semiconductor laser diode having the BH according to the present invention can obtain an electric isolation effect between adjacent devices due to the current blocking layer (poly-AlGaN layer or a-AlGaN layer), which is formed on the SiO$_2$ mask.

Meanwhile, certain embodiments of the present invention simultaneously grows the light generating layer and the current blocking layer on the substrate and the SiO$_2$ mask, respectively, through single growth by using the SiO$_2$ mask, thereby simplifying a semiconductor laser diode manufacturing process, reducing a cost for manufacturing a semiconductor laser diode and improving the yield of the semiconductor laser diode. Further, processes such as etching and re-growth used in manufacturing other semiconductor laser diodes, become unnecessary, and thus the semiconductor laser diode can be manufactured by a conventional growth method.

Accordingly, the present invention can realize a semiconductor laser diode having a high-efficiency buried heterostructure (BH) with low threshold current and high output.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor laser diode comprising:
   a substrate;
   a mask located on a surface of said substrate defining an area wherein said surface of said substrate is not covered by said mask;
   a light generating layer located on the substrate in said area of said surface of said substrate not covered by said mask;
   a current blocking layer located on the mask to confine current and light in a lateral direction in the light generating layer wherein an interface between the light generation layer and the current blocking layer extends at oblique angles outward from the light generating layer; and
   first and second electrodes that are formed on a surface of the substrate opposite to said light generating layer and on a surface of the light generating layer opposite to said substrate, respectively.

2. The diode of claim 1, wherein the light generating layer includes a first cladding layer, an active layer, and a second cladding layer, which are located in the recited sequence on the substrate.

3. The diode of claim 2, wherein the light generating layer further includes a first waveguide layer that is formed between the first cladding layer and the active layer, and a second waveguide layer that is formed between the second cladding layer and the active layer.

4. The diode of claim 1, wherein the light generating layer is a nitride-based compound semiconductor layer.

5. The diode of claim 2, wherein the light generating layer is a nitride-based compound semiconductor layer.

6. The diode of claim 3, wherein the light generating layer is a nitride-based compound semiconductor layer.

7. The diode of claim 4, wherein the nitride-based compound semiconductor layer is a GaN-based compound semiconductor layer.

8. The diode of claim 5, wherein the nitride-based compound semiconductor layer is a GaN-based compound semiconductor layer.

9. The diode of claim 6, wherein the nitride-based compound semiconductor layer is a GaN-based compound semiconductor layer.

10. The diode of claim 7, wherein the mask is a $SiO_2$ mask.

11. The diode of claim 8, wherein the mask is a $SiO_2$ mask.

12. The diode of claim 9, wherein the mask is a $SiO_2$ mask.

13. The diode of claim 7, wherein the current blocking layer is a poly-AlGaN layer or a-AlGaN layer.

14. The diode of claim 8, wherein the current blocking layer is a poly-AlGaN layer or a-AlGaN layer.

15. The diode of claim 9, wherein the current blocking layer is a poly-AlGaN layer or a-AlGaN layer.

16. The diode of claim 10, wherein the current blocking layer is a poly-AlGaN layer or a-AlGaN layer.

17. The diode of claim 11, wherein the current blocking layer is a poly-AlGaN layer or a-AlGaN layer.

18. The diode of claim 12, wherein the current blocking layer is a poly-AlGaN layer or a-AlGaN layer.

19. The diode of claim 7, further comprising a current confinement layer between the second electrode and the light generating layer.

20. The diode of claim 8, further comprising a current confinement layer between the second electrode and the light generating layer.

21. The diode of claim 9, further comprising a current confinement layer between the second electrode and the light generating layer.

22. The diode of claim 19, wherein the current confinement layer is a polyimide layer.

23. The diode of claim 20, wherein the current confinement layer is a polyimide layer.

24. The diode of claim 21, wherein the current confinement layer is a polyimide layer.

25. A method for fabricating a semiconductor laser diode, the method comprising:
    forming a mask on a surface of a substrate, said mask defining an area wherein said surface of said substrate is not covered by said mask;
    simultaneously forming a light generating layer and a current blocking layer on the substrate on said area of said surface of said substrate not covered by said mask and on the mask, respectively; and
    forming first and second electrodes on a surface of the substrate opposite, to said light generating layer and on a surface of the light generating layer opposite to said substrate, respectively.

26. The method of claim 25, wherein the step of forming a light generating layer includes the step of sequentially forming a first cladding layer, an active layer, and a second cladding layer on the substrate.

27. The method of claim 26, further comprising the step of forming a first waveguide layer between the first cladding layer and the active layer.

28. The method of claim 26, further comprising the step of forming a second waveguide layer between the second cladding layer and the active layer.

29. The method of claim 27, further comprising the step of forming a second waveguide layer between the second cladding layer and the active layer.

30. The method of claim 25, wherein the light generating layer is formed of an nitride-based compound semiconductor layer.

31. The method of claim 30, wherein the mask is formed of $SiO_2$.

32. The method of claim 31, wherein the current blocking layer is formed of poly-AlGaN or a-AlGaN.

33. The method of claim 30, wherein before forming first and second electrodes, a current confinement layer for confining current flowing from the second electrode is formed on the light generating layer.

34. The method of claim 33, wherein the current confinement layer is formed of polyimide.

* * * * *